United States Patent
Song

(10) Patent No.: US 7,977,125 B2
(45) Date of Patent: Jul. 12, 2011

(54) DISPLAY APPARATUS AND METHOD OF MANUFACTURING THE SAME

(75) Inventor: Keun-Kyu Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 12/255,577

(22) Filed: Oct. 21, 2008

(65) Prior Publication Data
US 2009/0140269 A1   Jun. 4, 2009

(30) Foreign Application Priority Data

Dec. 4, 2007 (KR) .................. 10-2007-0125007

(51) Int. Cl.
*H01L 21/66* (2006.01)
(52) U.S. Cl. ............. 438/17; 438/22; 438/28; 438/14; 257/88; 257/48; 257/E21.531; 257/E21.529; 257/E21.53; 257/E21.521
(58) Field of Classification Search .............. 257/88, 257/E33.056, E21.531, 48, E21.529, E21.53, 257/E21.521; 438/17, 22, 28, 14
See application file for complete search history.

(56) References Cited

U.S. PATENT DOCUMENTS

| 5,994,174 A * | 11/1999 | Carey et al. ................. 438/166 |
| 2004/0109102 A1* | 6/2004 | Chang et al. ................ 349/44 |
| 2007/0120790 A1* | 5/2007 | Jeon ............................. 345/87 |

FOREIGN PATENT DOCUMENTS

| JP | 2001-053282 | 2/2001 |
| JP | 2006-013444 | 1/2006 |
| KR | 10-2007-0018456 A | 2/2007 |
| KR | 10-2007-0076843 A | 7/2007 |

* cited by examiner

Primary Examiner — Ngan Ngo
Assistant Examiner — Benjamin Tzu-Hung Liu
(74) Attorney, Agent, or Firm — Innovation Counsel LLP

(57) ABSTRACT

In a display apparatus and a method of manufacturing the display apparatus, a gate line, a data line, and a plurality of layers are formed on an array substrate on which a pixel area, a pad area, and a peripheral area are defined. During the forming processes of the gate line, the data line, and the layers, the gate line and the data line are partially exposed in the peripheral area, or contact portions formed on the gate line and the data line in the peripheral area are exposed. Thus, the gate line and the data line may be tested using the contact portions as electrical terminals during the manufacturing process of the display apparatus.

9 Claims, 23 Drawing Sheets

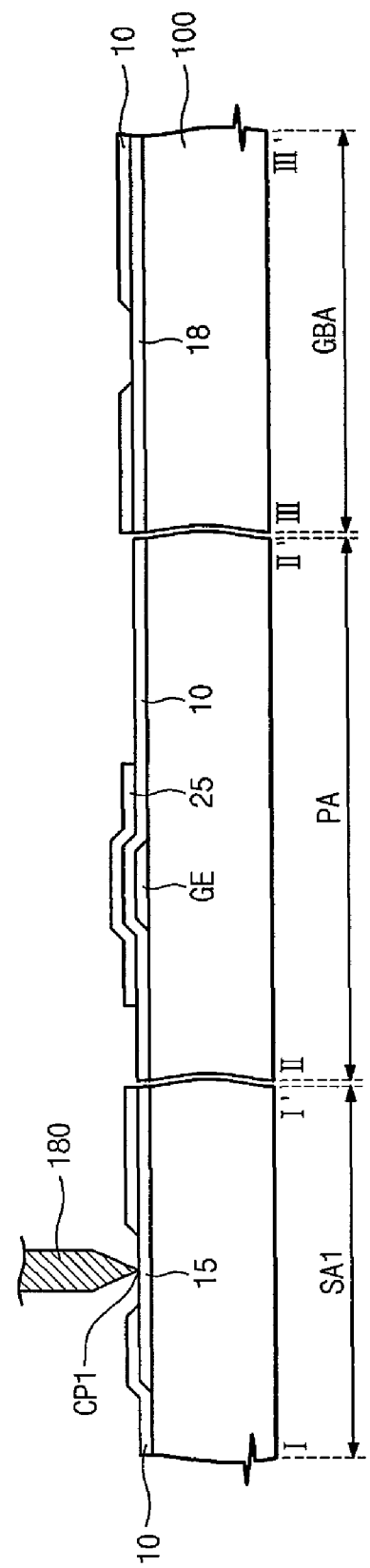

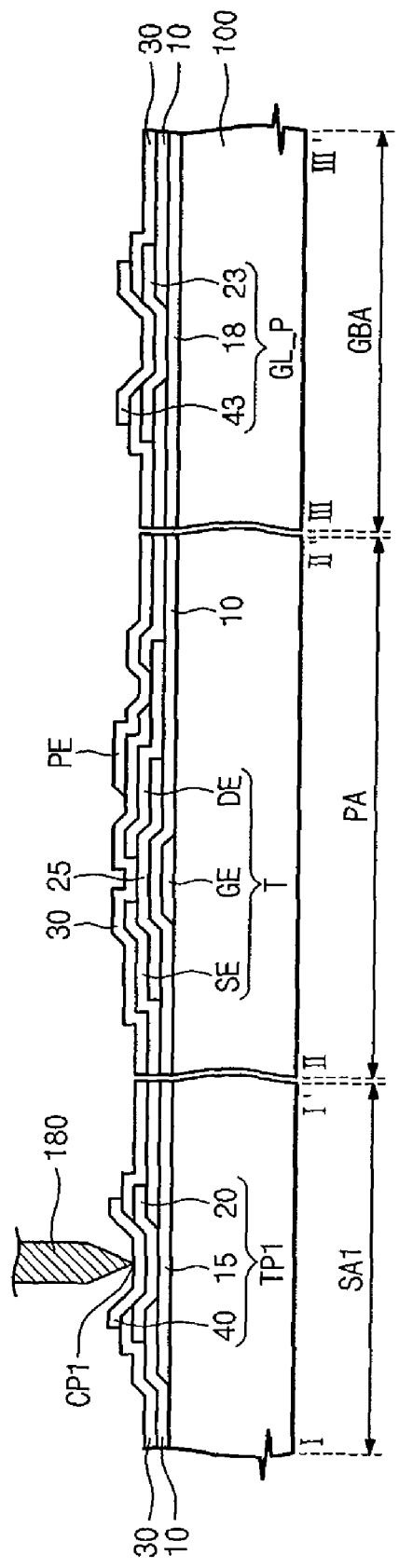

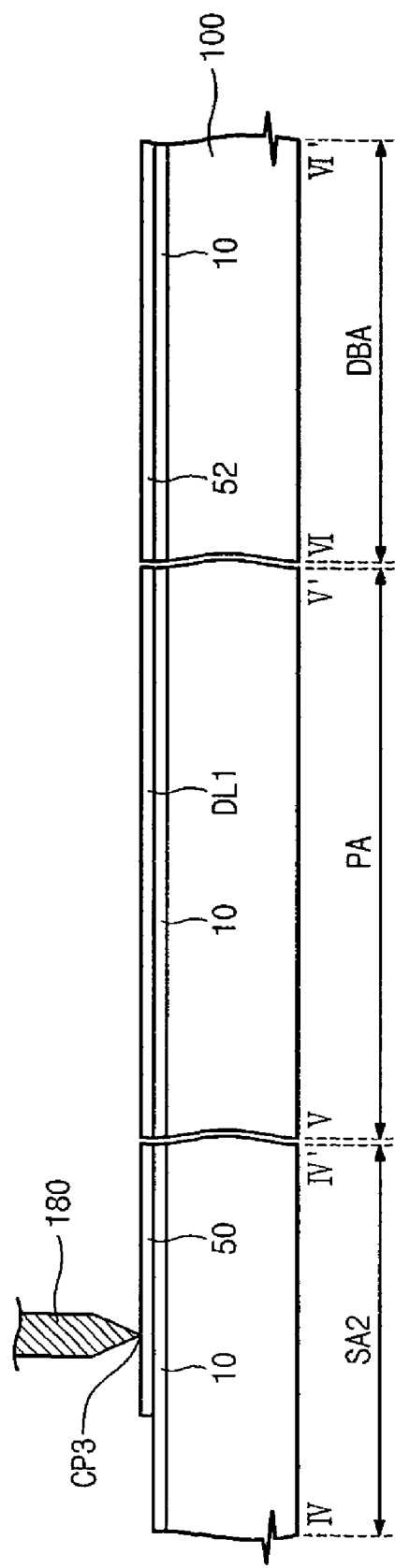

DISPLAY APPARATUS AND METHOD OF MANUFACTURING THE SAME

CROSS-REFERENCE TO RELATED APPLICATION

This application relies for priority upon Korean Patent Application No. 10-2007-125007 filed on Dec. 4, 2007, in the Korean Intellectual Property Office, the contents of which are herein incorporated by reference in their entirety.

BACKGROUND OF THE INVENTION

1. Field of the Invention

The present invention relates to a display apparatus and a method of manufacturing the display apparatus.

2. Description of the Related Art

In general, a display apparatus includes a display substrate to display an image. The display substrate includes gate lines and data lines that are insulated from each other and that intersect each other to define a plurality of pixel areas on the display area. Also, a thin film transistor and a pixel electrode that is electrically connected to the thin film transistor are formed on the display substrate corresponding to each pixel area.

In the case that the display substrate includes a plastic material, the display substrate is flexibly bent when an external impact is applied to the display substrate. Furthermore, the display substrate is easily deformed when heated by an external heat source. As a result, when the gate line or the data line including a metal material is formed on the display substrate that includes the plastic material, the gate line or the data line may break while the external heat is applied to the display substrate because the metal material has less elasticity than the plastic material.

SUMMARY OF THE INVENTION

The present invention provides a display apparatus in which gate lines and data lines may be tested after various steps during the fabrication of the display apparatus.

The present invention also provides a method of manufacturing the above display apparatus.

In one aspect of the present invention, a display apparatus includes a first substrate on which a pixel area, a first pad area, and a second pad area are defined and a second substrate facing the first substrate. Also, the display apparatus includes a gate line arranged on the first substrate to include a gate pad in the first pad area, a data line arranged above the first substrate to include a data pad in the second pad area, a pixel electrode formed in the pixel area, a common electrode formed on the second substrate, and a first test pad.

The first test pad is formed in a first peripheral area that is spaced apart from the first pad area, and the first test pad includes a first contact portion that is arranged above the gate line and electrically connected to the gate line.

In another aspect of the present invention, a method of manufacturing a display apparatus is provided as follows.

When a first substrate on which a pixel area, a first pad area, and a second pad area are defined is prepared, a gate line is formed on the first substrate and a first insulating layer pattern is formed on the gate line. A data line is formed on the first substrate. A first contact portion is formed above the gate line and electrically connected to the gate line in a first peripheral area that is spaced apart from the first pad area to form a first test pad. A second insulating layer pattern is formed on the data line. A pixel electrode is formed in the pixel area, and a second substrate on which a common electrode is formed is combined with the first substrate.

According to the above, the gate line and the data line may be tested before or after each thin layer is formed to check their function.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1A:
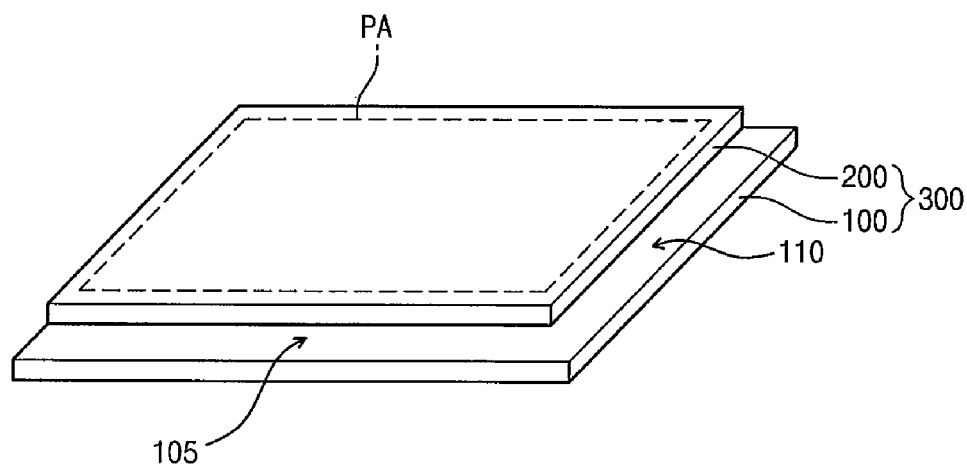
FIG. 1A is a perspective view showing an exemplary embodiment of a liquid crystal display according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
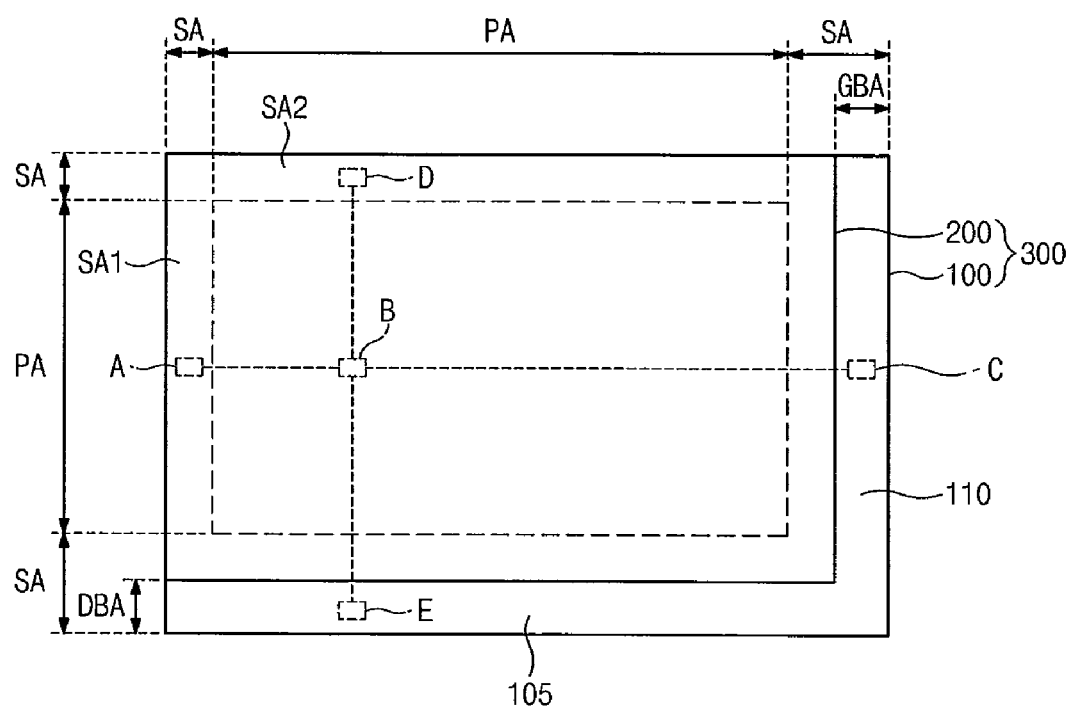
FIG. 1B is a top plan view showing the liquid crystal display of FIG. 1A.

FIG. 1A is a perspective view showing an exemplary embodiment of a liquid crystal display according to the present invention, and FIG. 1B is a top plan view showing the liquid crystal display of FIG. 1A. The liquid crystal display is exemplary of a variety of different types of display apparatus.

Referring to FIGS. 1A and 1B, a liquid crystal display 300 includes an array substrate 100, an opposite substrate 200 facing the array substrate 100, and a liquid crystal layer (not shown) interposed between the array substrate 100 and the opposite substrate 200.

The array substrate 100 and the opposite substrate 200 may include a plastic material and have a plate-like shape or a sheet-like shape. Accordingly, even though an external pressure is applied to the liquid crystal display 300, the liquid crystal display 300 may be not damaged since it may be flexibly bent.

A pixel area PA is defined in the array substrate 100. The pixel area PA serves as an area where an image is displayed in the liquid crystal display 300. The pixel area PA may hereinafter be referred to as the pixel array area PA. The pixel area PA contains a rectangular array of pixel electrodes and associated thin film transistors arranged on the array substrate 100. Detailed descriptions of the above arrangement of the thin film transistor and the pixel electrode are provided with reference to FIG. 2A.

Also, a peripheral area SA is defined in the array substrate 100. The peripheral area SA is arranged outside the pixel area PA and surrounds the pixel area PA. The peripheral area SA includes a gate bonding area GBA and a data bonding area DBA. The gate bonding area GBA may hereinafter be referred to as a first pad area GBA. The data bonding area DBA may hereinafter be referred to as a second pad area DBA. The peripheral area SA also includes a first peripheral area SA1 that is spaced apart from the gate bonding area GBA and a second peripheral area SA2 that is spaced apart from the data bonding area DBA as shown in FIG. 1B. The pixel area PA is located between the first periphery area SA1 and the gate bonding area GBA and the pixel area PA is also located between the second periphery area SA2 and the data bonding area DBA.

The array substrate 100 includes a gate bonding part 110 arranged in the gate bonding area GBA and a data bonding part 105 arranged in the data bonding area DBA.

Although not shown in FIGS. 1A and 1B, the thin film transistors in the pixel area PA are electrically connected to a gate driver (not shown) in the gate bonding part 110 and are electrically connected to a data driver (not shown) in the data bonding part 105. Thus, a thin film transistor may receive from the gate driver a gate signal that switches the thin film transistor, and the thin film transistor may receive from the data driver a pixel voltage that the thin film transistor transmits to a pixel electrode.

Figure 2A:
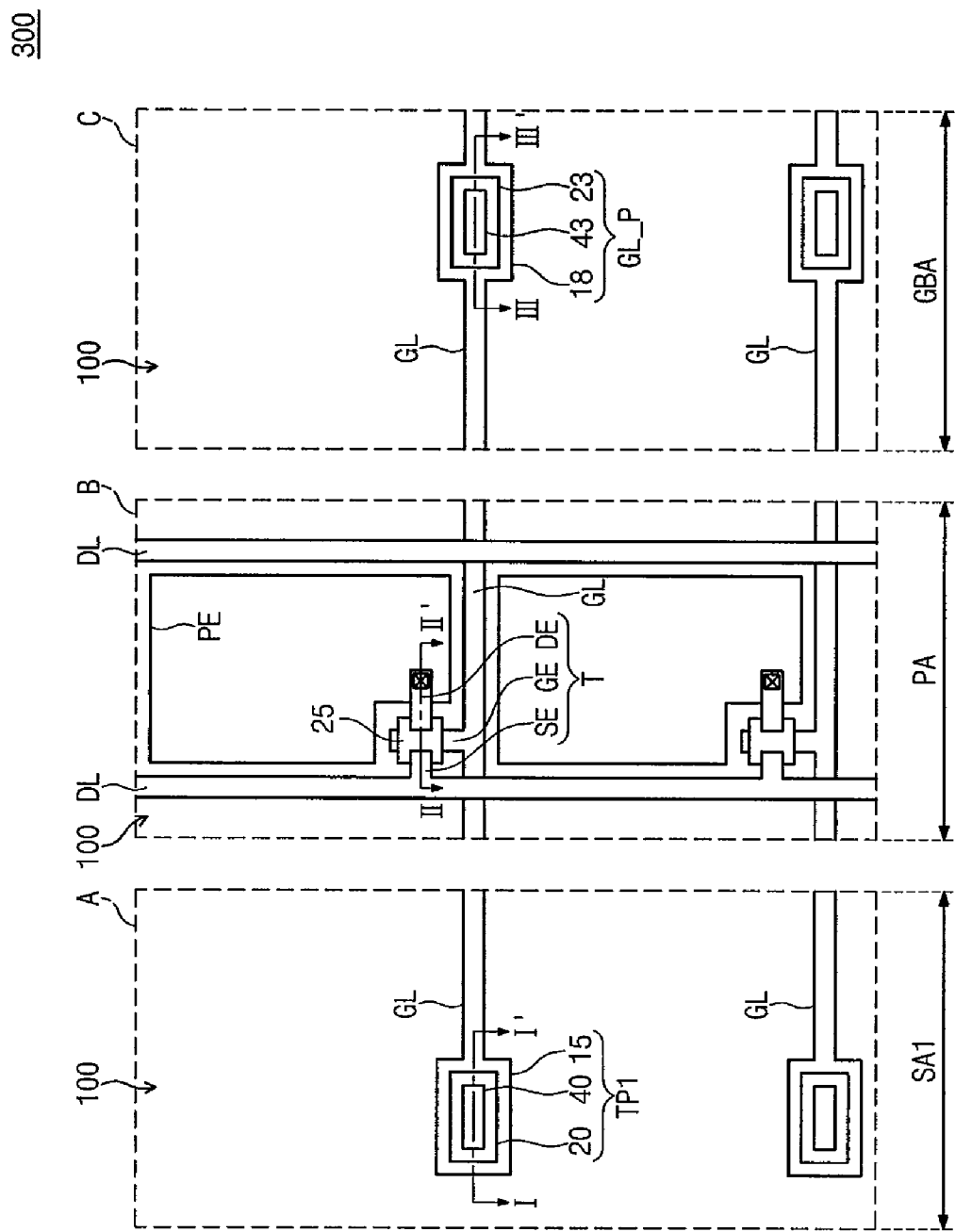
FIG. 2A is an enlarged view of portions A, B and C of FIG. 1B.

FIG. 2A is an enlarged view of portions A, B and C of FIG. 1B. In FIG. 1B, the liquid crystal display 300 including the array substrate 100 and the opposite substrate 200 are shown. However, the liquid crystal display 300 will be described after omitting the opposite substrate 200 in FIG. 2A in order to clearly show the structure of the array substrate 100.

Referring to FIG. 2A, a plurality of gate lines GL is arranged on the array substrate 100 and extended in a first direction, and a plurality of data lines DL is arranged on the array substrate 100 and extended in a second direction that is substantially perpendicular to the first direction. Also, the thin film transistor T and the pixel electrode PE are arranged in the pixel area PA of the array substrate 100.

The thin film transistor T includes a source electrode SE, a drain electrode DE, and a gate electrode GE. The source electrode SE is branched from the data line DL, the gate electrode GE is branched from the gate line GL, and the drain electrode DE is spaced apart from the source electrode SE. Also, an active pattern 25 that is partially overlapped by both the source electrode SE and the drain electrode DE is arranged on the gate electrode GE.

The pixel electrode PE is electrically connected to the drain electrode DE. Thus, when the thin film transistor T is turned on in response to a gate voltage applied through the gate line GL, the pixel voltage provided through the data line DL is applied to the pixel electrode PE through the source electrode SE, the active pattern 25, and the drain electrode DE.

The array substrate 100 further includes a first test pad TP1 arranged in the first peripheral area SA1 and a gate line pad GL_P arranged in the gate bonding area GBA. Hereinafter, the gate line pad GL_P may be referred to as a gate pad GL_P, or referred to as a gate line bonding pad GL_P.

The first test pad TP1 includes a first gate line end portion 15, a first contact portion 20, and a second contact portion 40. The first gate line end portion 15 is extended from the gate line GL and corresponds to a first end portion of the gate line GL. Also, the first contact portion 20 is arranged on, that is to say positioned above, the first gate line end portion 15 and is electrically connected to the first gate line end portion 15, and the second contact portion 40 is arranged on, that is to say positioned above, the first contact portion 20 and is electrically connected to the first contact portion 20.

The first test pad TP1 is formed in order to permit testing of the gate line GL during a manufacturing process of the liquid crystal display 300. That is, after various steps in the manufacturing of the liquid crystal display 300, the first test pad TP1 is used as a terminal to test whether the gate line GL is disconnected or shorted. Detailed descriptions of the above test process of the gate line GL are presented with reference to FIGS. 6A to 11B.

The gate line pad GL_P includes a second gate line end portion 18, a third contact portion 23, and a fourth contact portion 43. The second gate line end portion 18 is extended from the gate line GL and corresponds to a second end portion of the gate line GL. Also, the third contact portion 23 is arranged on, that is to say positioned above, the second gate line end portion 18 and is electrically connected to the second gate line end portion 18, and the fourth contact portion 43 is arranged on, that is to say positioned above, the third contact portion 23 and is electrically connected to the third contact portion 23.

The first contact portion 20 and the third contact portion 23 may include the same material as that of the data line DL. For example, if the data line DL is formed of a three-layered structure of metals including molybdenum-aluminum-molybdenum, each of the first contact portion 20 and the third contact portion 23 may include the same metal layers as those of the data line DL.

Also, the second contact portion 40 and the fourth contact portion 43 may include the same material as that of the pixel electrode PE. For example, if the pixel electrode PE includes indium tin oxide ITO, each of the second contact portion 40 and the fourth contact portion 43 may include the indium tin oxide ITO.

Figure 2B:
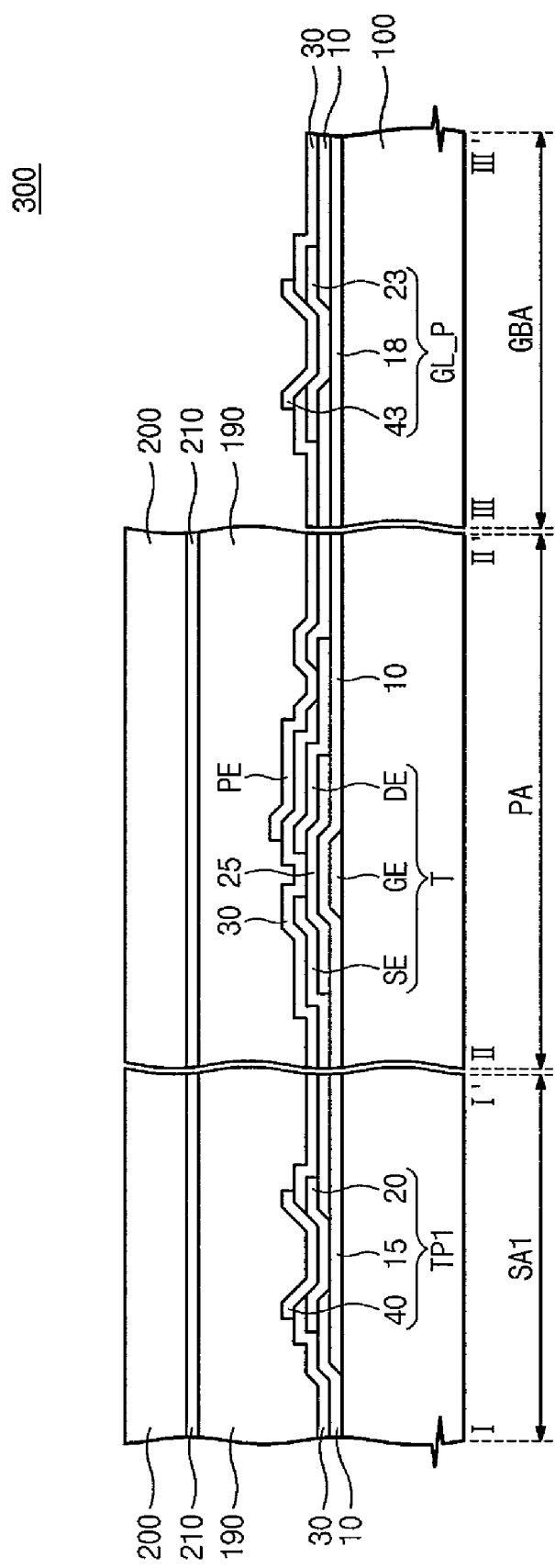
FIG. 2B is a cross-sectional view taken along lines of I-I', II-II', and III-III' of FIG. 2A.

FIG. 2B is a cross-sectional view taken along lines of I-I', II-II', and III-III' of FIG. 2A. In FIG. 2B, the same reference numerals denote the same elements in FIG. 2A, and thus the detailed descriptions of the same elements are omitted.

Referring to FIG. 2B, a gate insulating layer 10 is formed between the first gate line end portion 15 and the first contact portion 20 in the first peripheral area SA1. Also, an inter-insulating layer 30 is formed between the first contact portion 20 and the second contact portion 40 in the first peripheral area SA1. The gate insulating layer 10 is also formed on the gate line that extends from the first line end portion 15 to the second gate line end portion 18.

The gate insulating layer 10 is partially removed to form a thru-hole therethrough in the first peripheral area SA1, so that the first contact portion 20 makes contact with the first gate line end portion 15, and as a result, the first contact portion 20 may be electrically connected to the first gate line end portion 15. Also, the inter-insulating layer 30 is partially removed to form a thru-hole therethrough in the first peripheral area SA1, so that the second contact portion 40 makes contact with the first contact portion 20, and as a result, the second contact portion 40 may be electrically connected to the first contact portion 20.

The gate insulating layer 10 is formed on the gate electrode GE in the pixel area PA, and the active pattern 25 that overlaps the gate electrode GE is formed on the gate insulating layer 10. Also, the source electrode SE and the drain electrode DE, each partially overlapping the active pattern 25, are formed on the active pattern 25, and the inter-insulating layer 30 is formed on the source electrode SE and the drain electrode DE.

The pixel electrode PE is formed on the inter-insulating layer 30, and the inter-insulating layer 30 is partially removed to make the drain electrode DE and the pixel electrode PE be in contact with each other. As a result, the drain electrode DE may be electrically connected to the pixel electrode PE.

The gate insulating layer 10 is formed between the second gate line end portion 18 and the third contact portion 23 in the gate bonding area GBA. Also, the inter-insulating layer 30 is formed between the third contact portion 23 and the fourth contact portion 43 in the gate bonding area GBA.

The gate insulating layer 10 is partially removed in the gate bonding area GBA to make the third contact portion 23 and the second gate line end portion 18 be in contact with each other, so that the third contact portion 23 may be electrically connected to the second gate line end portion 18.

Also, the inter-insulating layer 30 is partially removed in the gate bonding area GBA to make the fourth contact portion 43 and the third contact portion 23 be in contact with each other, so that the fourth contact portion 43 may be electrically connected to the third contact portion 23.

The liquid crystal display 300 includes the opposite substrate 200 facing the array substrate 100. As shown in FIG. 1B, the opposite substrate 200 faces the array substrate 100 in the first peripheral area SA1, the second peripheral area SA2 and the pixel area PA, and the opposite substrate 200 does not overlap the gate bonding area GBA and the data bonding area DBA. That is, the opposite substrate 200 has a smaller area than that of the array substrate 100, and the opposite substrate 200 is combined with the array substrate 100, thereby exposing portions of the array substrate 100 corresponding to the gate bonding area GBA and the data bonding area DBA.

A common electrode 210 is formed on the opposite substrate 200. The common electrode 210 includes a transparent conductive layer such as indium tin oxide (ITO), and the common electrode 210 and the pixel electrode PE generate an electric field therebetween.

Liquid crystals 190 are interposed between the array substrate 100 and the opposite substrate 200. The orientation of the directors of the liquid crystals 190 is controlled by the electric field generated between the common electrode 210 and the pixel electrode PE. Although not shown in FIGS. 2A and 2B, the opposite substrate 200 may further include a black matrix that is arranged between color filters each having a predetermined color.

Figure 3A:
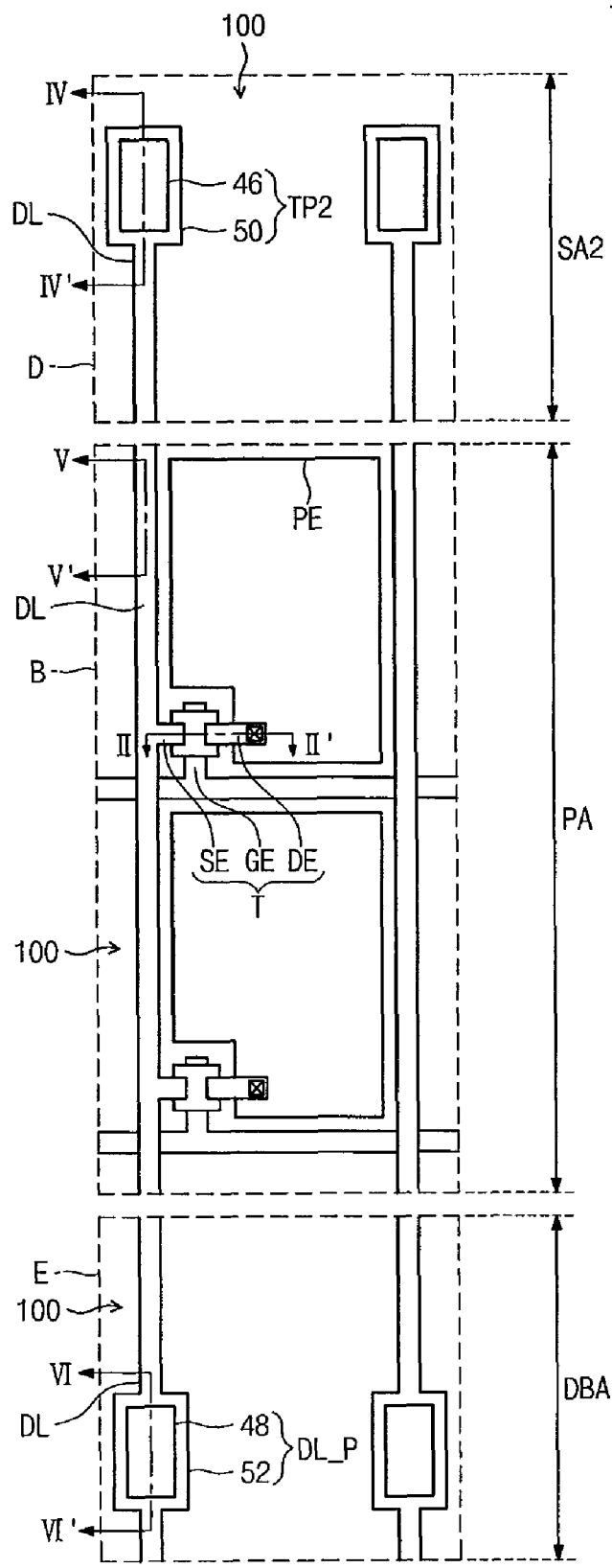
FIG. 3A is an enlarged view of portions of B, D, and E of FIG. 1B.

FIG. 3A is an enlarged view of portions of B, D, and E of FIG. 1B. In FIG. 1B, the liquid crystal display 300 including the array substrate 100 and the opposite substrate 200 is shown. However, the liquid crystal display 300 will be described after omitting the opposite substrate 200 in FIG. 3A in order to clearly show the structure of the array substrate 100. Further, in FIG. 3A, the same reference numerals denote the same elements in FIG. 2A, and thus the detailed descriptions of the same elements are omitted.

Referring to FIG. 3A, a second test pad TP2 is arranged on the array substrate 100 in the second peripheral area SA2, and a data line pad DL_P is arranged on the array substrate 100 in the data bonding area DBA. Hereinafter, the data line pad DL_P may be referred to as data pad DL_P or referred to as a data line bonding pad DL_P.

The second test pad TP2 includes a first data line end portion 50 and a fifth contact portion 46. The first data line end portion 50 corresponds to a first end portion of the data line DL and is extended from the data line DL. Also, the fifth contact portion 46 is arranged on, that is to say positioned above, the first data line end portion 50 and is electrically connected to the first data line end portion 50.

The data line pad DL_P includes a second data line end portion 52 and a sixth contact portion 48. The second data line end portion 52 corresponds to a second end portion of the data line DL and is extended from the data line DL. Also, the sixth contact portion 48 is arranged on, that is to say positioned above, the second data line end portion 52 and is electrically connected to the second data line end portion 52. The fifth contact portion 46 and the sixth contact portion 48 may include the same material as that of the pixel electrode PE. For example, when the pixel electrode PE includes indium tin oxide (ITO), each of the fifth contact portion 46 and the sixth contact portion 48 may include the indium tin oxide (ITO).

Figure 3B:
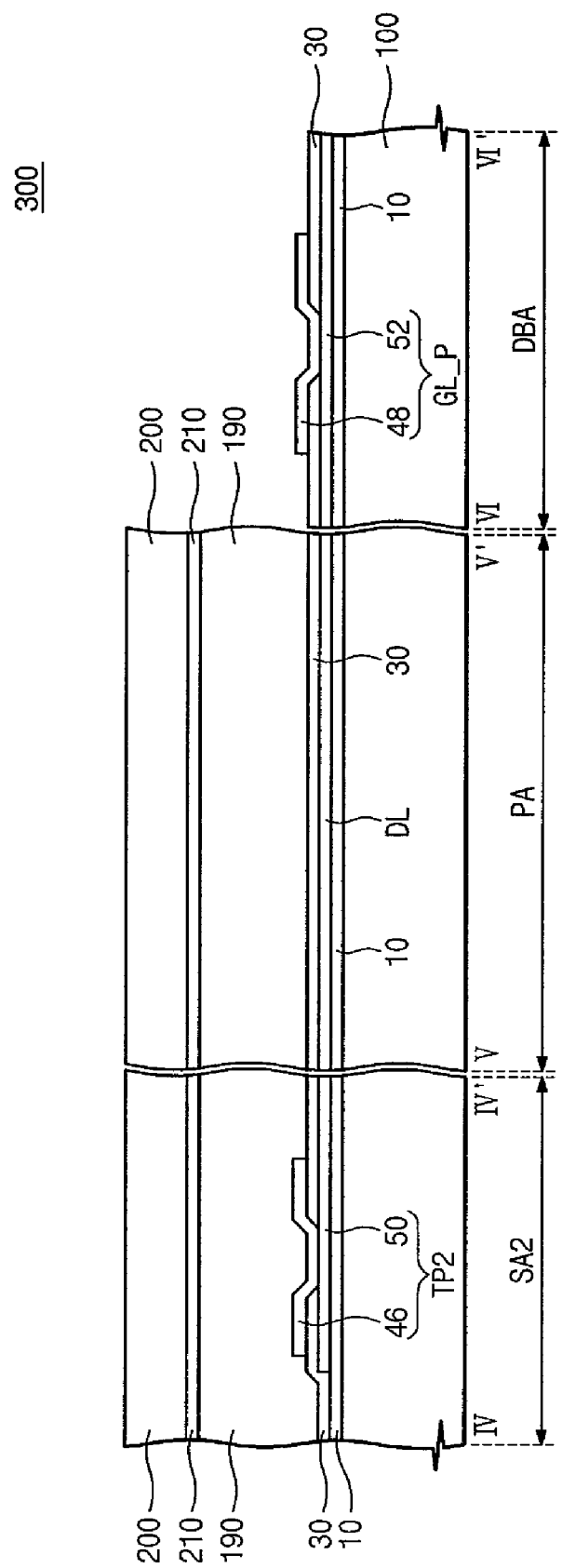
FIG. 3B is a cross-sectional view taken along lines IV-IV', V-V', and VI-VI' of FIG. 3A.

FIG. 3B is a cross-sectional view taken along lines IV-IV', V-V', and VI-VI' of FIG. 3A.

Referring to FIG. 3B, the gate insulating layer 10 is formed on the array substrate 100 in the second peripheral area SA2, and the inter-insulating layer 30 is formed under the fifth contact portion 46. The inter-insulating layer 30 is partially removed to form a thru-hole therethrough, so that the fifth contact portion 46 may be electrically connected to the first data line end portion 50 through the thru-hole.

In the pixel area PA, the gate insulating layer 10, the data line DL, and the inter-insulating layer 30 are sequentially layered on the array substrate 100.

In the data bonding area DBA, the gate insulating layer 10 is formed on the array substrate 100, and the inter-insulating layer 30 is formed under the sixth contact portion 48. The inter-insulating layer 30 is partially removed to make the sixth contact portion 48 and the second data line end portion 52 be in contact with each other, and as a result, the sixth contact portion 48 may be electrically connected to the second data line end portion 52.

Figure 4:
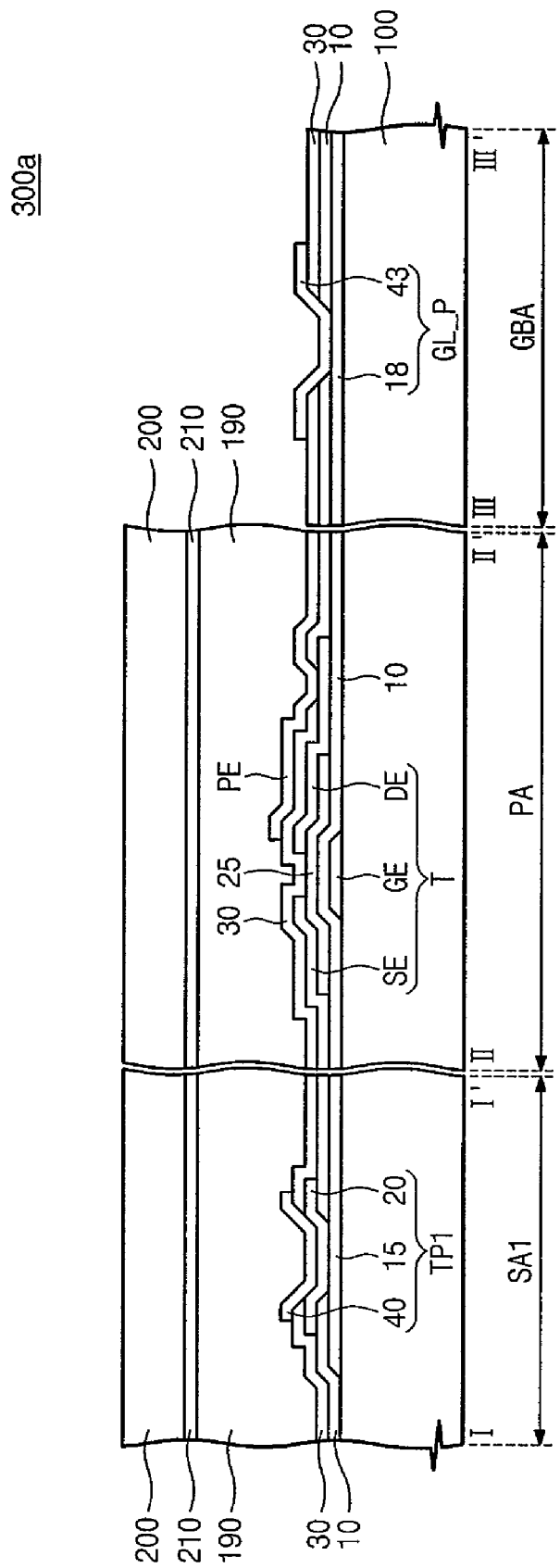
FIG. 4 is a cross-sectional view showing another exemplary embodiment of a liquid crystal display according to the present invention.

FIG. 4 is a cross-sectional view showing another exemplary embodiment of a liquid crystal display according to the present invention. In FIG. 4, the same reference numerals denote the same elements in FIG. 2B, and thus the detailed descriptions of the same elements are avoided.

Referring to FIG. 4, a liquid crystal display 300a includes a first test pad TP1 in a first peripheral area SA1, and the first test pad TP1 includes a first gate line end portion 15, a first contact portion 20, and a second contact portion 40. Also, the liquid crystal display 300a includes a gate line pad GL_P in a gate bonding area GBA, and the gate line pad GL_P includes a second gate line end portion 18 and a fourth contact portion 43 that is arranged on the second gate line end portion 18. The inter-insulating layer 30 and the gate insulating layer 10 are partially removed to from a thru-hole in the data bonding area DBA so that the fourth contact portion 43 makes contact with the second data line end portion 18 and as a result the fourth contact portion 43 may be electrically connected to the second gate line end portion 18.

That is, the gate line pad GL_P does not need a separate contact portion between the second gate line end portion 18 and the fourth contact portion 43, and thus the first test pad TP1 and the gate line pad GL_P may have a different structure from each other.

Figure 5A:
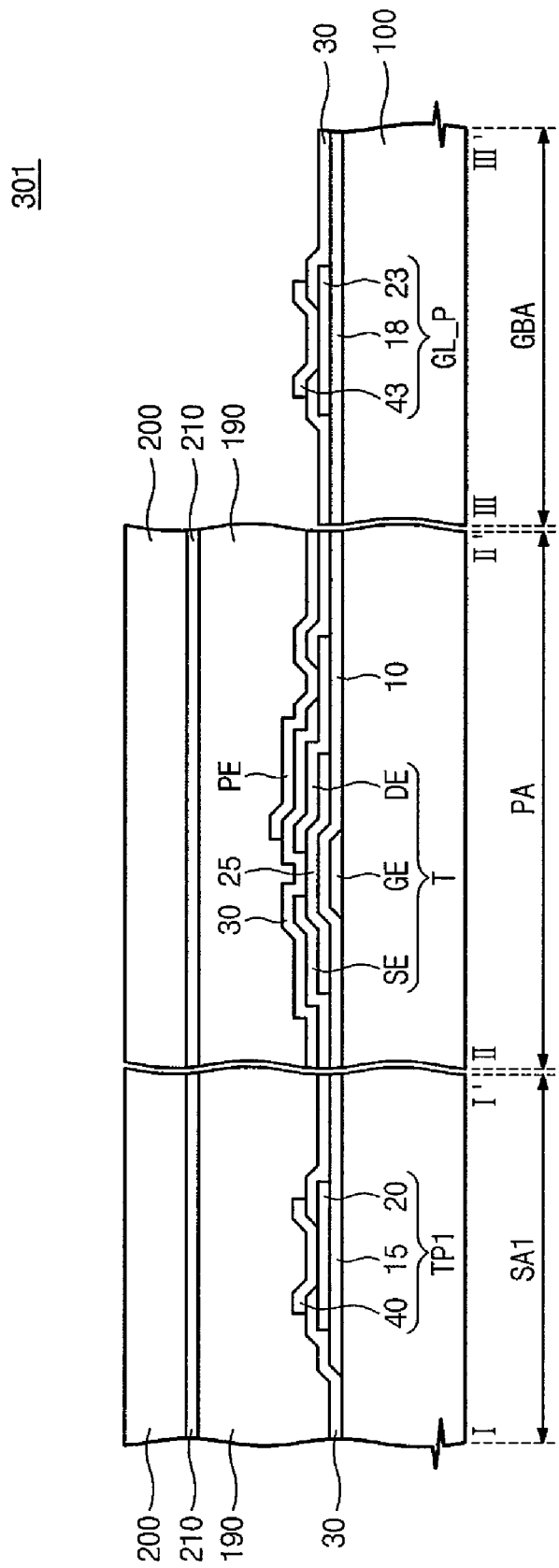
FIGS. 5A and 5B are cross-sectional views showing another exemplary embodiment of a liquid crystal display according to the present invention.
Figure 5B:
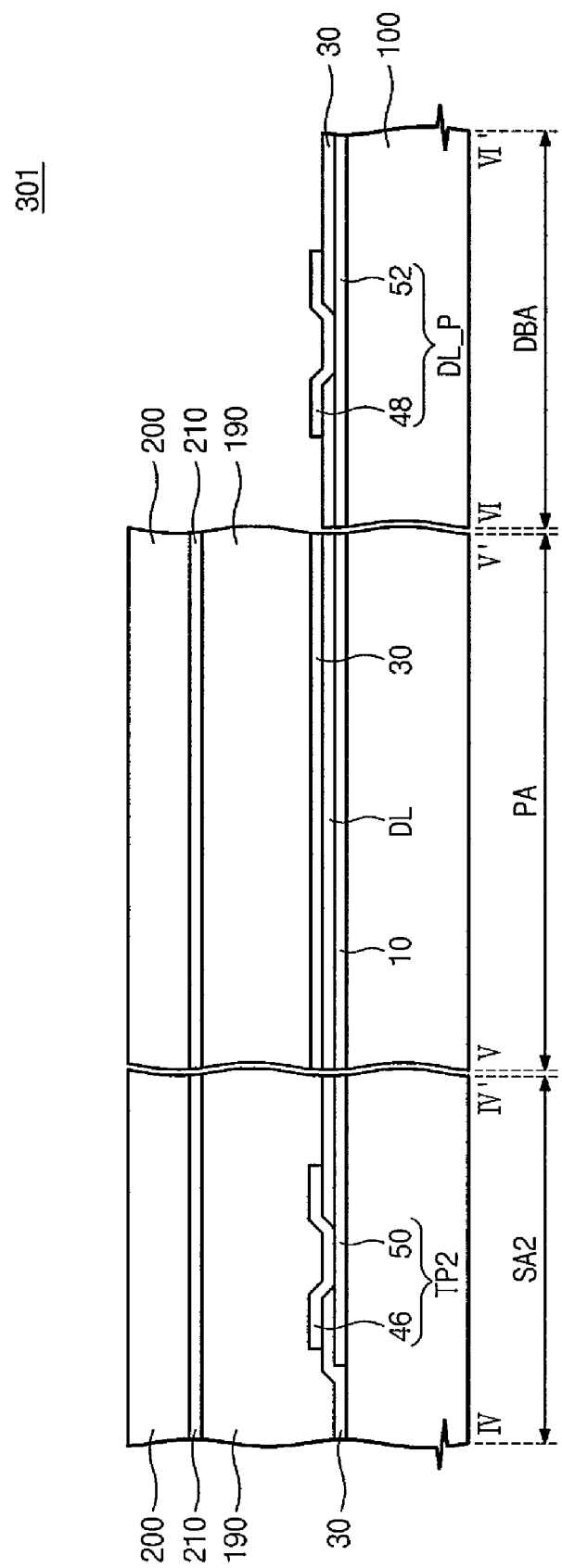

FIGS. 5A and 5B are cross-sectional views showing another exemplary embodiment of a liquid crystal display according to the present invention. In FIGS. 5A and 5B, the same reference numerals denote the same elements in FIGS. 2A and 2B, and thus the detailed descriptions of the same elements will be omitted.

FIG. 5A shows the cross-sectional structures of a liquid crystal display 301 taken along the lines I-I', II-II', and III-III' of FIG. 2A. Also, FIG. 5B shows the cross-sectional structures of the liquid crystal display 301 taken along the lines IV-IV', V-V', and VI-VI' of FIG. 3A.

Referring to FIGS. 5A and 5B, a gate insulating layer 10 is formed on a gate electrode GE in a pixel area PA, however, the gate insulating layer 10 is removed from the first peripheral area SA1, the second peripheral area SA2, the gate bonding area GBA, and the data bonding area DBA.

Therefore, a first gate line end portion 15 is arranged on the array substrate 100 in the first peripheral area SA1 that is spaced apart from the gate bonding area GBA, the pixel area PA being located between the first peripheral area SA1 and the gate bonding area GBA, and a second gate line end portion 18 is arranged on the array substrate 100 in the gate bonding area GBA.

Also, a first data line end portion 50 is arranged on the array substrate 100 in the second peripheral area SA2 that is spaced apart from the data bonding area DBA, the pixel area PA being located between the second peripheral area SA2 and the data bonding area DBA, and a second data line end portion 52 is arranged on the array substrate 100 in the data bonding area DBA.

FIGS. 6A to 11B are plan views and cross-sectional views illustrating a manufacturing method of the liquid crystal display of FIG. 1B. In FIGS. 6A to 11B, the same reference numerals denote the same elements of FIGS. 1A to 5B, and thus the detailed descriptions of the same elements are omitted.

Figure 6A:
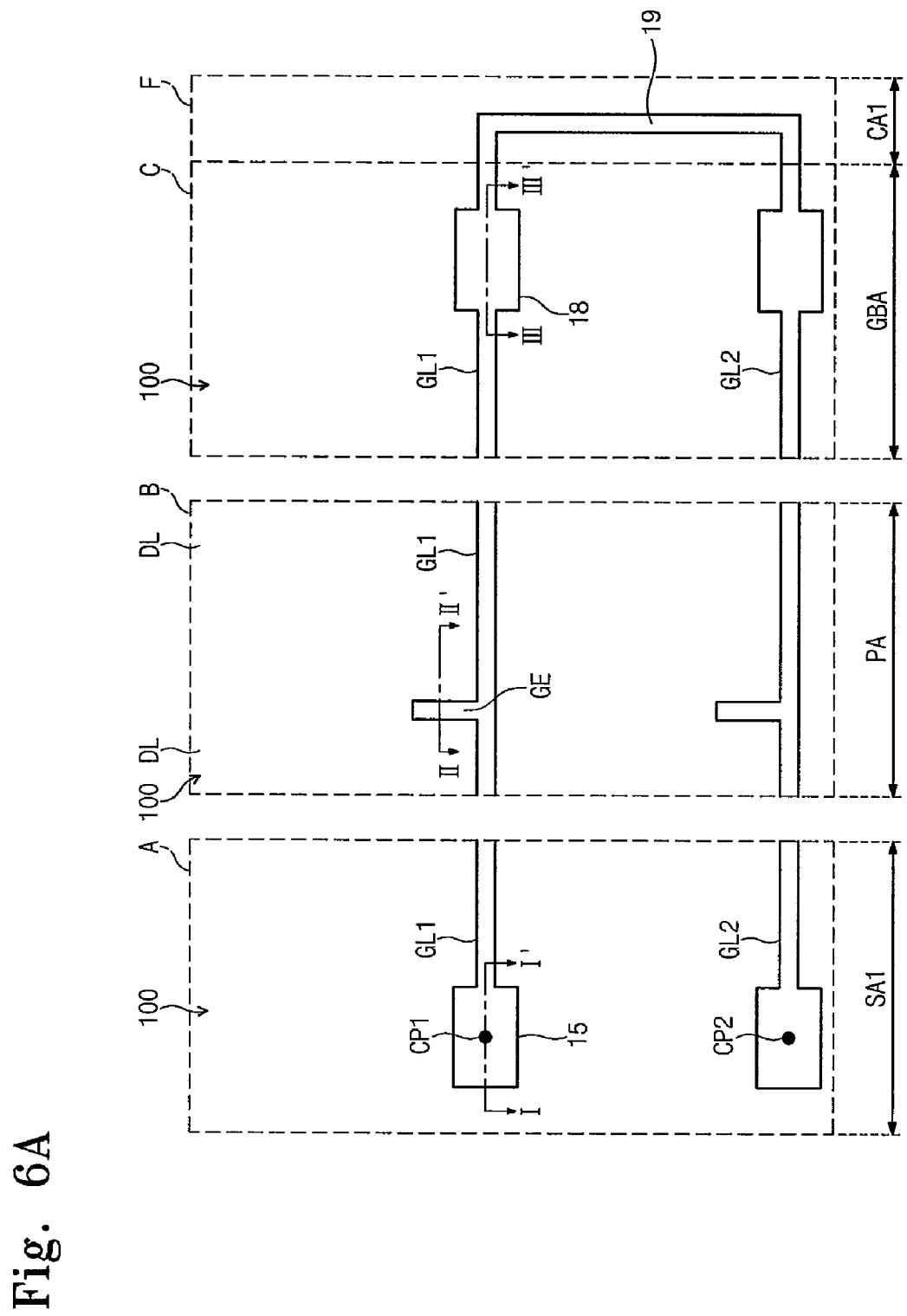
FIGS. 6A to 11B are plan views and cross-sectional views illustrating a manufacturing method of a liquid crystal display of FIG. 1B.
Figure 6B:
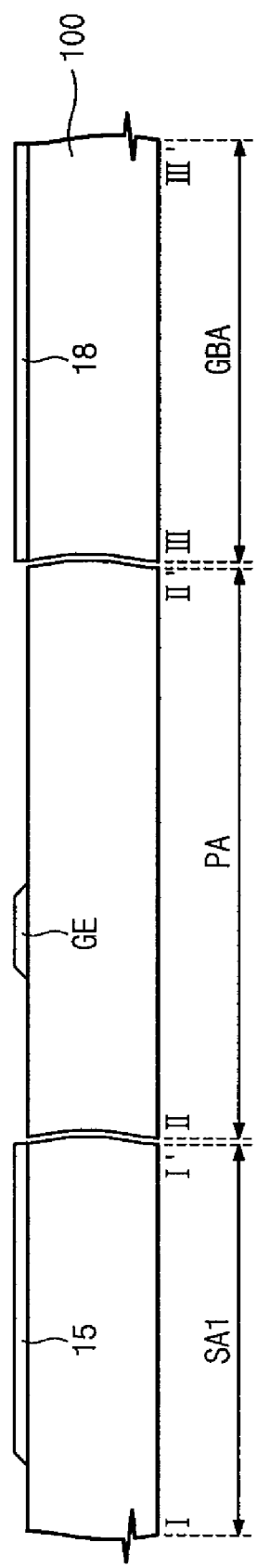

FIG. 6A is a plan view illustrating a fabricating method of a first gate line and a second gate line on an array substrate, and FIG. 6B is a cross-sectional view taken along lines I-I', II-II', and III-III' of FIG. 6A.

Referring to FIGS. 6A and 6B, a first gate line GL1 including a first gate line end portion 15, a second gate line end portion 18, and a gate electrode GE are formed on the array substrate 100. More particularly, the first gate line end portion 15 is formed in the first peripheral area SA1, the first gate line GL1 is formed in the pixel area PA, and the second gate line end portion 18 is formed in the gate bonding area GBA. The first gate line end portion 15 may hereinafter be referred to as a gate line test portion 15 and the second gate line end portion may hereinafter be referred to as a gate line bonding portion 18.

Also, a first cut-away area CA1 is defined outside of the gate bonding area GBA in the array substrate 100. A preliminary gate line 19 is formed in the first cut-away area CA1, and the preliminary gate line 19 electrically connects the first gate line GL1 and a second gate line GL2 that is adjacent to the first gate line GL1. The preliminary gate line 19 is temporarily formed on the array substrate 100 during a fabricating process of the array substrate 100. When the array substrate 100 is completely fabricated, the first cut-away area CA1 is cut away, thereby removing the preliminary gate line 19 from the array substrate 100.

The first gate line GL1, the second gate line GL2, the first gate line end portion 15, the second gate line end portion 18, and the gate electrode GE may be formed by forming a conductive layer (not shown) on the array substrate 100 and patterning the conductive layer using a photolithographic method.

Figure 6C:
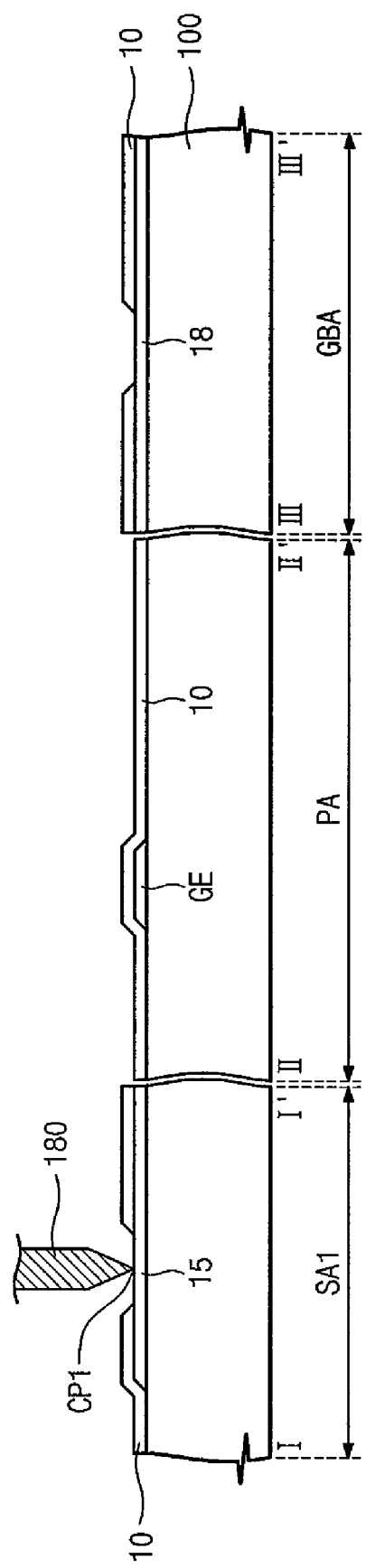

FIG. 6C is a cross-sectional view of the array substrate after the gate insulating layer has been deposited on the array substrate and patterned to provide thru-holes.

Referring to FIG. 6C, the gate insulating layer 10 is formed on the array substrate 100. The gate insulating layer 10 is patterned to cover the gate electrode GE in the pixel area PA, to partially expose the first gate line end portion 15 in the first peripheral area SA1, and to partially expose the second gate line end portion 18 in the gate bonding area GBA.

Referring again to FIG. 6C, the gate insulating layer 10 is formed on the array substrate 100, and then, an electrical signal is applied to a first contact point CP1 through a test pin 180. When the electrical signal is applied to the first contact point CP1, the electrical signal is transmitted from the first gate line GL1 to the second gate line GL2 through the preliminary gate line 19. Thus, the electrical signal may be output through a second contact point CP2 located on the second gate line GL2 in the first peripheral area SA 1. Accordingly, a function test of the first gate line GL1 and the second gate line GL2 may be performed by reading the electrical signal input to the first contact point CP1 and output from the second contact point CP2. A second test pin (not shown) may be used at the second contact point CP2.

The function test for the first and second gate lines GL1 and GL2 is performed to check for a break in either the first gate line GL1 or the second gate line GL2 and to check whether the first gate line GL1 and the second gate line GL2 are shorted to each other.

Figure 7A:
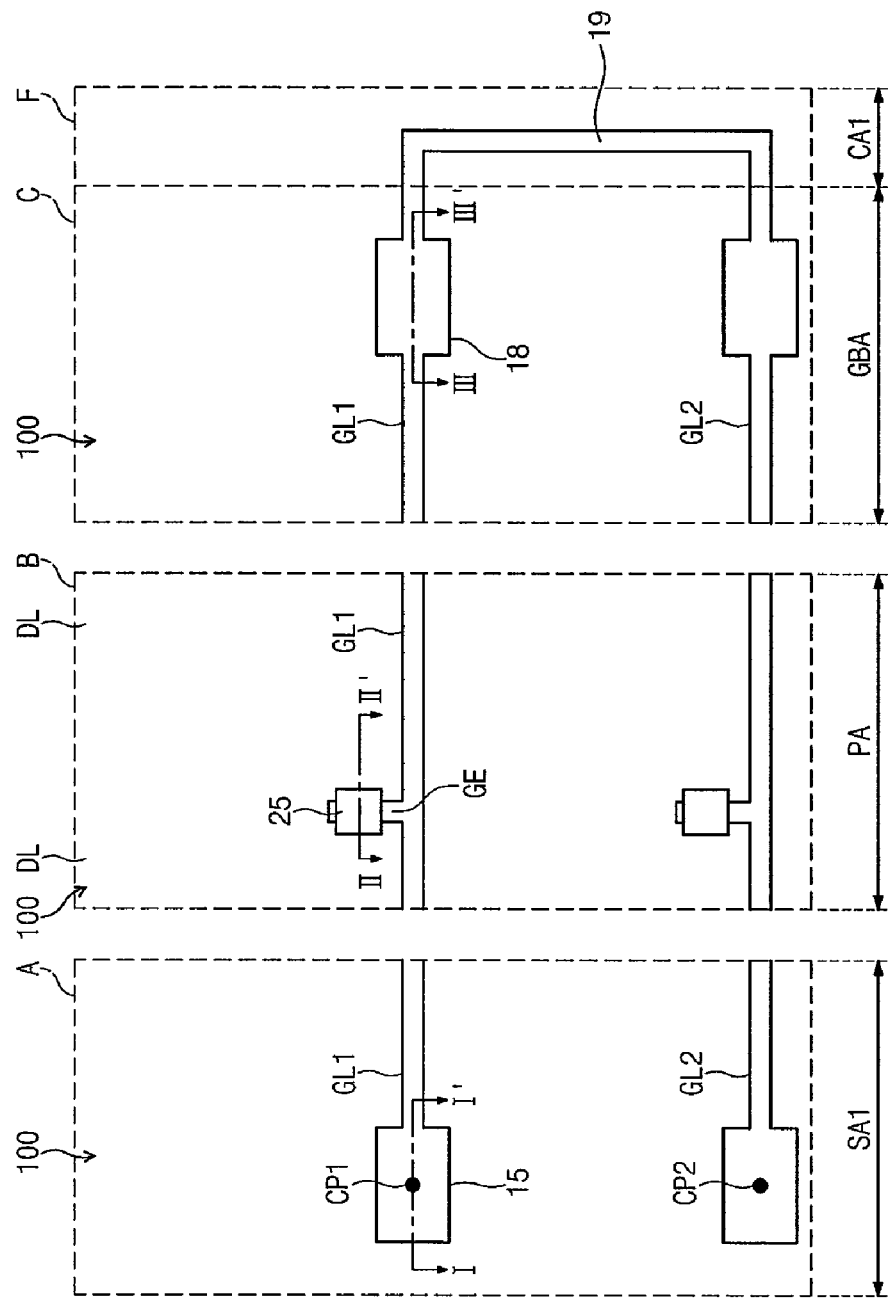

FIG. 7A is a plan view of the array substrate after the active pattern has been formed on the array substrate, and FIG. 7B is a cross-sectional view taken along lines I-I', II-II', and III-III' of FIG. 7A.

Referring to FIGS. 7A and 7B, the active pattern 25 that overlaps the gate electrode GE is formed in the pixel area PA. The active pattern 25 may be a portion of a thin film of a semiconductor material. After the active pattern 25 is formed on the array substrate 100, a function test of the first gate line GL1 and the second gate line GL2 is performed by the electrical signal input to the first contact point CP1 through a first test pin 180 and output from the second contact point CP2 through a second test pin (not shown). The function test may be performed to check whether the first gate line GL1 and the second gate line GL2 are broken and/or to check whether the first gate line GL1 and the second gate line GL2 are shorted to each other.

When the array substrate 100 is exposed to heat in order to form the active pattern 25, the array substrate 100 may be deformed by the heat, so that the first gate line GL1 and the second gate line GL2 may be broken or the first gate line GL1 and the second gate line GL2 may be shorted to each other. Accordingly, when the function test is performed after the active pattern 25 is formed on the array substrate 100, a malfunction that occurred in the first and second gate lines GL1 and GL2 during the forming process of the active pattern 25 may be checked.

Figure 8A:
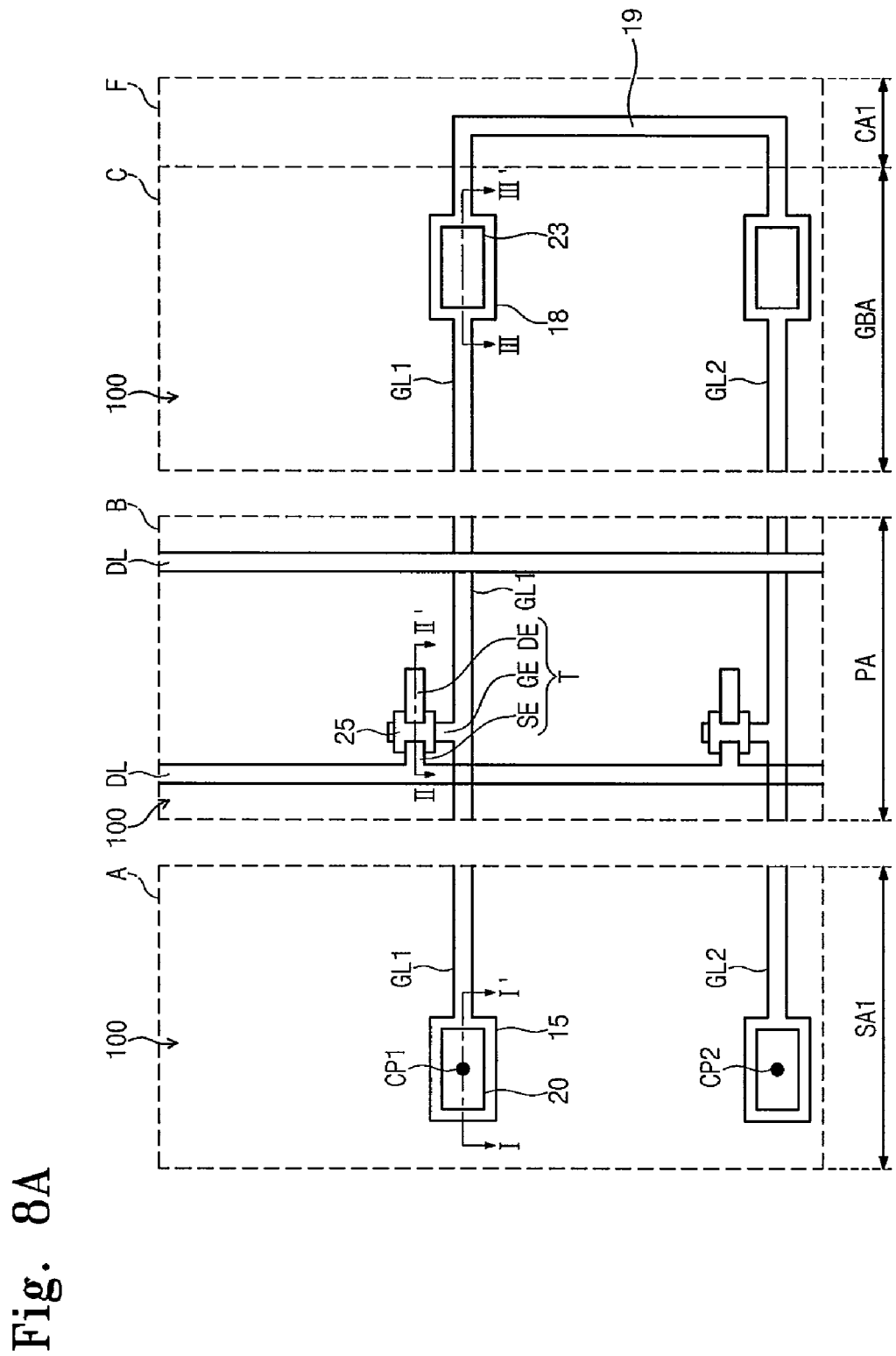
Figure 8B:
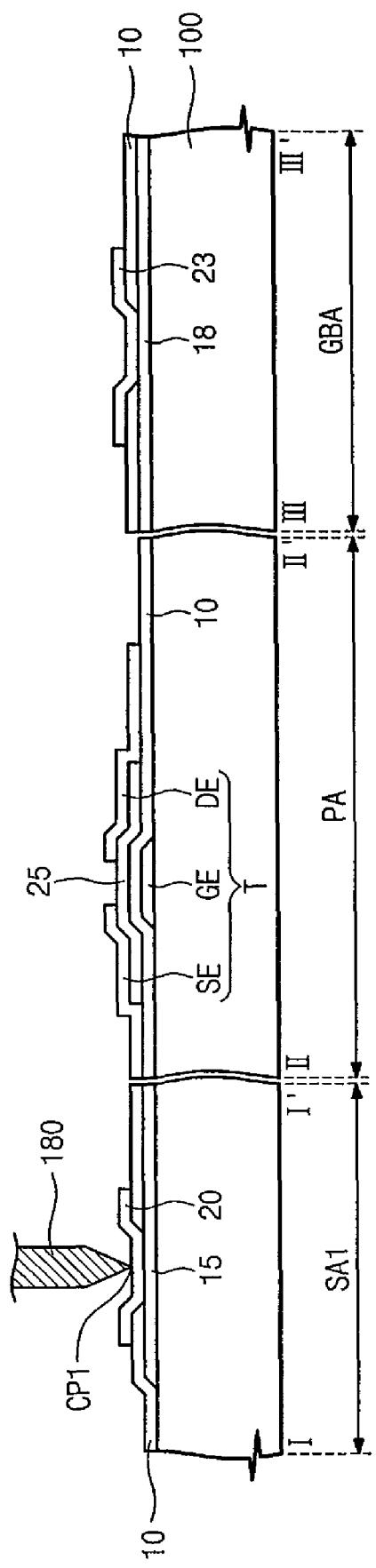

FIG. 8A is a plan view of the array substrate after data metal has been deposited and patterned to provide the data line DL on the array substrate, and FIG. 8B is a cross-sectional view taken along lines I-I', II-II', and III-III' of FIG. 8A.

Referring to FIGS. 8A and 8B, the first contact portion 20 is formed on the first gate line end portion 15 in the first peripheral area SA1, the source electrode SE and the drain electrode DE are formed in the pixel area PA, and the third contact portion 23 is formed on the second gate line end portion 18 in the gate bonding area GBA. Since the first contact portion 20, the source electrode SE, the drain electrode DE, and the third contact portion 23 may be formed through a same process, the first contact portion 20, the source electrode SE, the drain electrode DE, and the third contact portion 23 may include a same material.

After the first contact portion 20, the source electrode SE, the drain electrode DE, and the third contact portion 23 are formed on the array substrate 100, the function test of the first gate line GL1 and the second gate line GL2 is performed by the electrical signal input to the first contact point CP1 through a first test pin 180 and output from the second contact point CP2 through a second test pin (not shown). The function test is performed to check whether the first gate line GL1 and the second gate line GL2 are broken and/or to check whether the first gate line GL1 and the second gate line GL2 are shorted to each other.

Meanwhile, before the first contact portion 20 and the third contact portion 23 are formed on the array substrate 100, the gate insulating layer 10 is partially removed to expose the first gate line end portion 15 and the second gate line end portion 18. Therefore, even though the first contact portion 20 and the third contact portion 23 may be omitted, the function test of the first and second gate lines GL1 and GL2 may be performed after the source electrode SE and the drain electrode DE are formed.

However, in the case that the first gate line end portion 15 and the second gate line end portion 18 include the same material as that of the source electrode SE and the drain electrode DE, the first gate line end portion 15 and the second gate line end portion 18 may be inadvertently etched by an etchant that is used to pattern the source electrode SE and the drain electrode DE. Accordingly, it is desirable that the first contact portion 20 and the third contact portion 23 be formed when the source electrode SE and the drain electrode DE are formed.

Figure 8C:
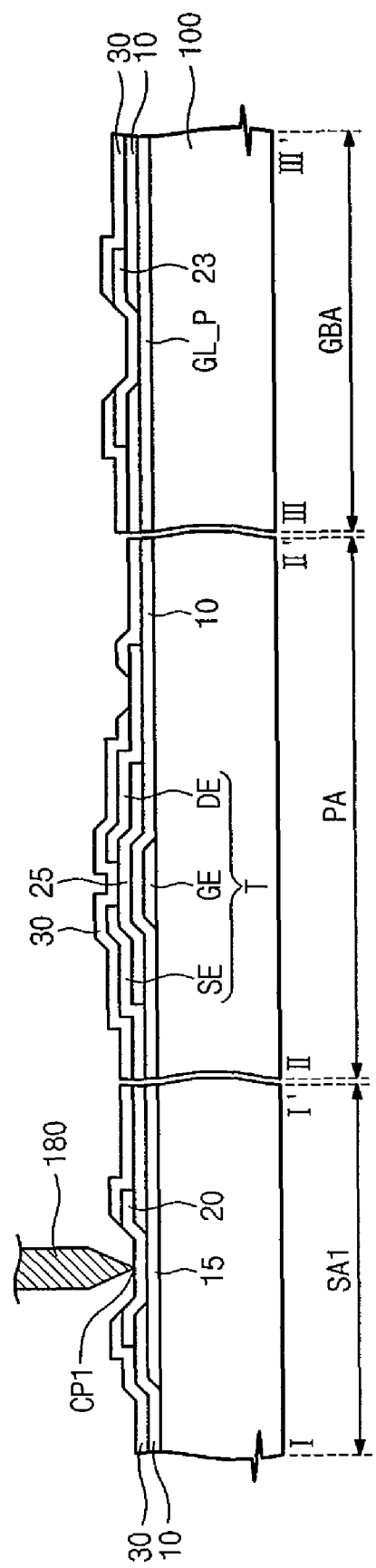

FIG. 8C is a cross-sectional view illustrating a forming method of the inter-insulating layer pattern on the array substrate.

Referring to FIG. 8C, the inter-insulating layer 30 is formed on the array substrate 100 to cover the above-mentioned elements previously formed on the array substrate 100. More particularly, the inter-insulating layer 30 is partially removed to expose the first contact portion 20 in the peripheral area SA, is partially removed to expose the drain electrode DE in the pixel area PA, and is partially removed to expose to the third contact portion 23 in the gate bonding area GBA. The remainder of the inter-insulating layer 30 may be referred to as an inter-insulating layer pattern.

After the inter-insulating layer 30 is formed on the array substrate 100, the function of the first gate line GL1 and the second gate line GL2 is tested by the electrical signal input to the first contact point CP1 through a first test pin 180 and output from the second contact point CP2 through a second the test pin (not shown). The function test may be further performed to check whether the first gate line GL1 and the second gate line GL2 are broken and/or to check whether the first gate line GL1 and the second gate line GL2 are shorted to each other.

Figure 9A:
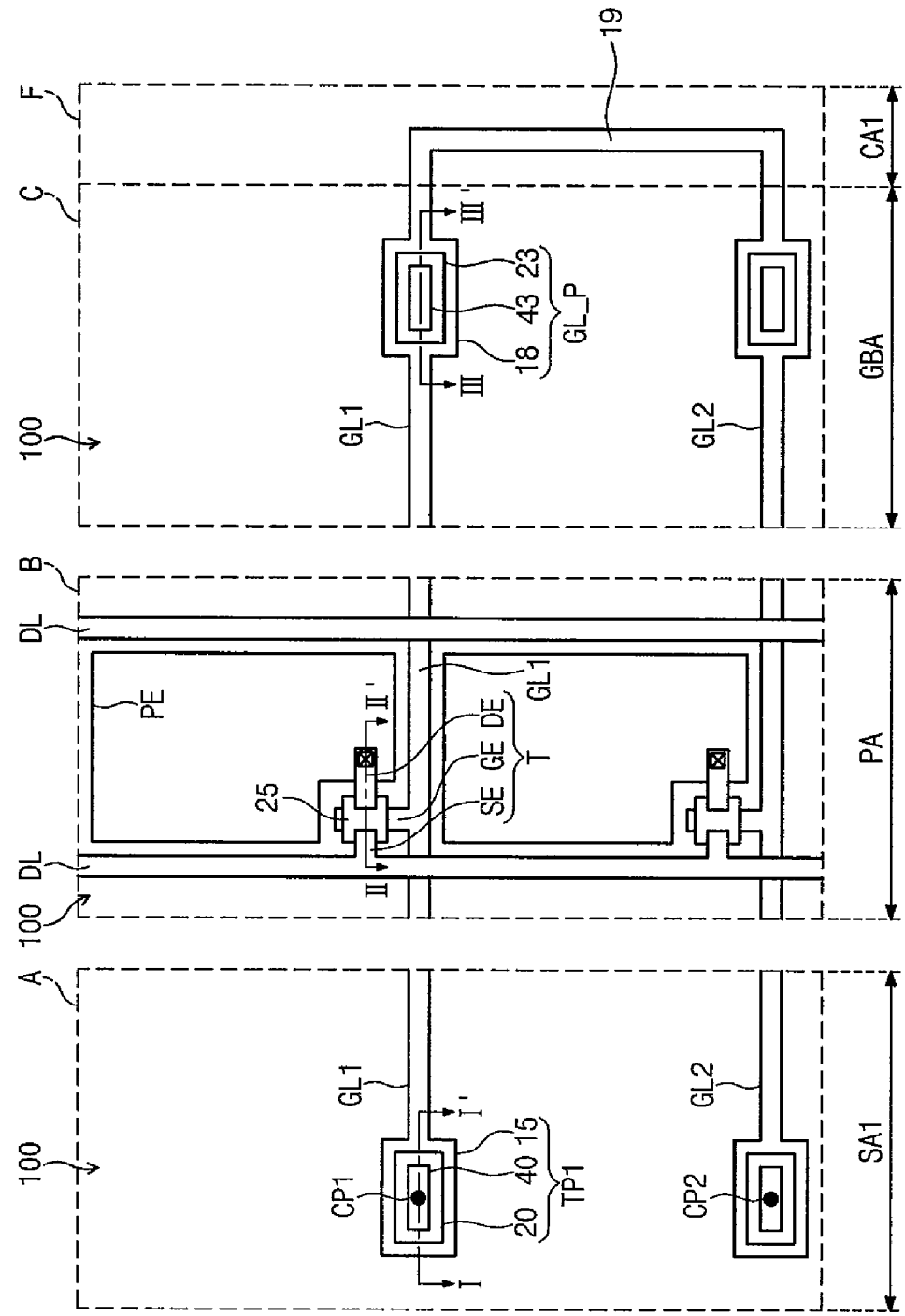

FIG. 9A is a plan view illustrating a forming method of the pixel electrode PE on the array substrate, and FIG. 9B is a cross-sectional view taken along lines I-I', II-II', and III-III' of FIG. 9A.

Referring to FIGS. 9A and 9B, the second contact portion 40, the pixel electrode PE, and the fourth contact portion 43 are formed on the array substrate 100. More particularly, the second contact portion 40 is formed above the first contact portion 20 in the first peripheral area SA1 and electrically connected to the first contact portion 20. The pixel electrode PE is formed above the drain electrode DE in the pixel area PA and electrically connected to the drain electrode DE. The fourth contact portion 43 is formed above the third contact portion 23 in the gate bonding area GBA and electrically connected to the third contact portion 23.

After the second contact portion 40, the pixel electrode PE, and the fourth contact portion 43 are formed on the array substrate 100, a function test of the first gate line GL1 and the second gate line GL2 is performed by an electrical signal input to the first contact point CP1 through the first test pin 180 and output from the second contact point CP2 through a second test pin (not shown). The function test is performed to check whether the first gate line GL1 and the second gate line GL2 are broken and/or to check whether the first gate line GL1 and the second gate line GL2 are shorted to each other.

In the present exemplary embodiment, in order to test the first gate line GL1 and the second gate line GL2 that are electrically connected to each other through the preliminary gate line 19, the electrical signal input to the first contact point CP1 and output from the second contact point CP2 is used. However, the function test may be individually performed with respect to each of the first gate line GL1 and the second gate line GL2. For instance, when the first gate line GL1 is formed, a gate line test part (not shown) may be further formed between the pixel area PA and the gate bonding area GBA. Then, the first gate line GL1 may be tested by using the first gate line end portion 15 and the gate line test part. The gate line test part may be extended from the first gate line GL1, and the gate line test part may have a same structure as that of the first test pad TP1 and a width that is wider than the first gate line GL1.

Figure 10A:
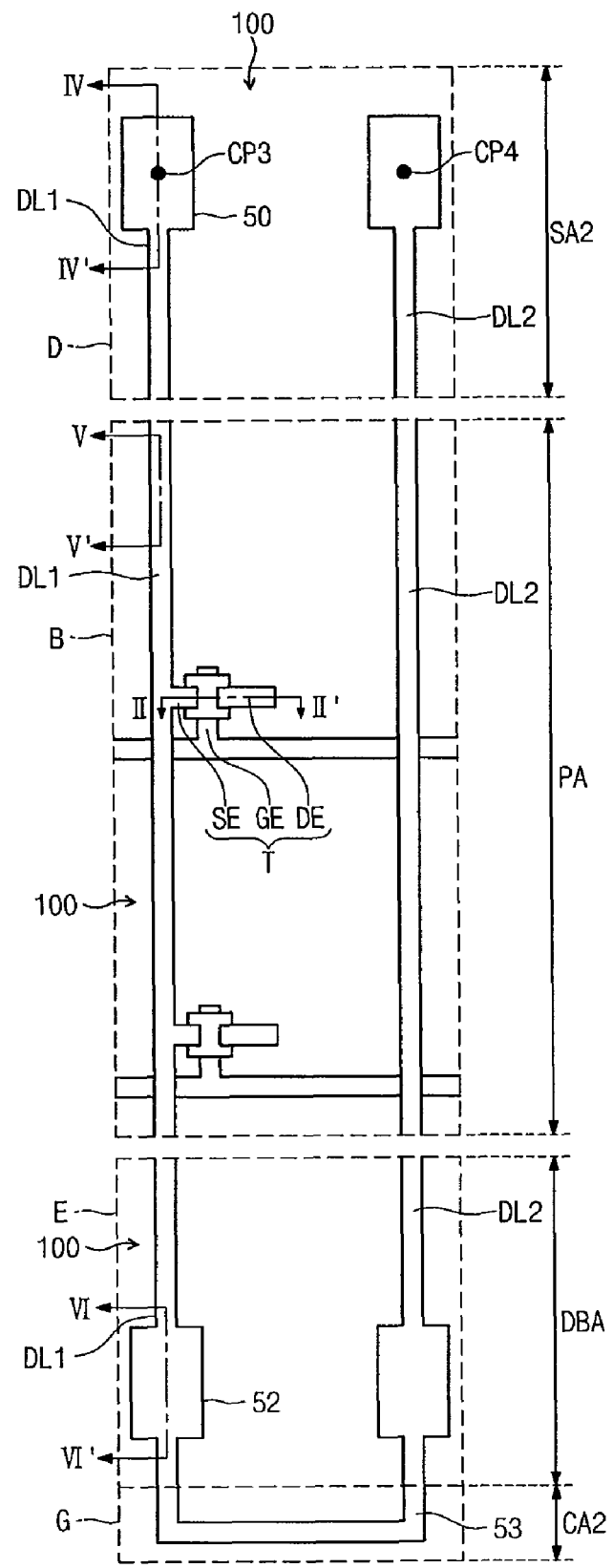

FIG. 10A is a plan view illustrating a forming method of the first data line and the second data line on the array substrate, and FIG. 10B is a cross-sectional view taken along line IV-IV', V-V', and VI-VI' of FIG. 10A.

Referring to FIGS. 10A and 10B, a first data line DL1, the first data line end portion 50, and the second data line end portion 52 are formed on the gate insulating layer 10 formed on the array substrate 100. More particularly, the first data line end portion 50 is formed in the second peripheral area SA2, the first data line DL1 is formed in the pixel area PA, and the second data line end portion 52 is formed in the data bonding area DBA.

Also, a second cut-away area CA2 is defined outside of the data bonding area DBA. A preliminary data line 53 is formed in the second cut-away area CA2, and the preliminary data line 53 electrically connects the first data line DL1 and a second data line DL2 that is adjacent to the first data line DL1. The preliminary data line 53 is temporarily formed on the array substrate 100 during the forming process of the first data line DL1 and the second data line DL2 on the array substrate 100. Thus, when the array substrate 100 is completely formed, the second cut-away area CA2 is cut away and the preliminary data lien 53 is removed from the array substrate 100.

Referring again to FIG. 10A, the first data line end portion 50, the second data line end portion 52, and the first and second data lines DL1 and DL2 may be formed through a same process as the first contact portion 20, the third contact portion 23, the source electrode SE and the drain electrode DE and may include a same material with the first contact portion 20, the third contact portion 23, the source electrode SE, and the drain electrode DE. That is, plan views in FIG. 8A and FIG. 10A are taken from different portions of the liquid crystal display, but the forming process of the liquid crystal display shown in FIG. 8A and FIG. 10A are the same.

After the first data line end portion 50, the second data line end portion 52, and the first and second data lines DL1 and DL2 are formed on the array substrate 100, an electrical signal is applied to a third contact point CP3 using a third test pin 180. When the electrical signal is applied to the third contact point CP3, the electrical signal is transmitted from the first data line DL1 to the second data line DL2 through the preliminary data line 53. Thus, the electrical signal may be output through a fourth contact point CP4 located on the second data line DL2, and a function test of the first data line DL1 and the second data line DL2 may be performed by reading the electrical signal input to the third contact point CP3 and output from the fourth contact point CP4. The electrical signal at the fourth contact point CP4 may be read through a fourth test pin (not shown).

The function test is performed to check whether the first data line DL1 and the second data line DL2 are broken and/or to check whether the first data line DL1 and the second data line DL2 are shorted to each other.

Figure 10C:
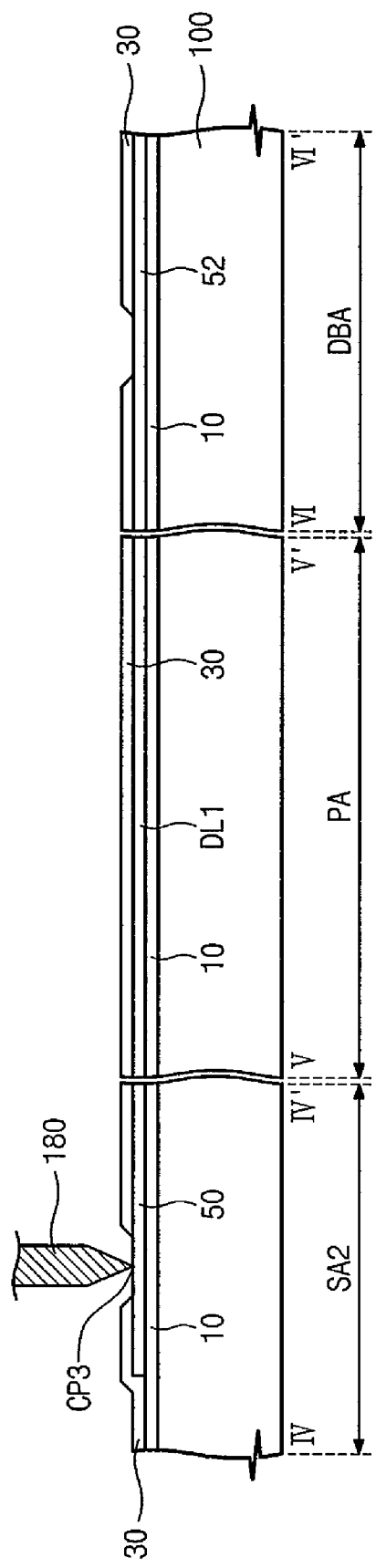

FIG. 10C is a cross-sectional view illustrating a forming method of the inter-insulating layer pattern on the array substrate.

Referring to FIG. 10C, the inter-insulating layer 30 is formed on the array substrate 100 to cover the above-mentioned elements previously formed on the array substrate 100. More particularly, the inter-insulating layer 30 is partially removed to expose the first data line end portion 50 in the second peripheral area SA2, is formed to cover the first data line DL1 in the pixel area PA, and is partially removed to expose the second data line end portion 52 in the data bonding area DBA. Thus, the forming of the inter-insulating layer pattern is completed.

Cross-sectional views in FIG. 8C and FIG. 10C are taken from different portions of the liquid crystal display, but the manufacturing processes of the liquid crystal display shown in FIG. 8C and FIG. 10C are the same.

After the inter-insulating layer 30 is formed on the array substrate 100, the function test of the first data line DL1 and the second data line DL2 is performed by an electrical signal input to the third contact point CP3 through the third test pin 180 and output from the fourth contact point CP4 through a fourth test pin (not shown). The function test is performed to check whether the first data line DL1 and the second data line DL2 are broken and/or to check whether the first data line DL1 and the second data line DL2 are shorted to each other.

Figure 11A:
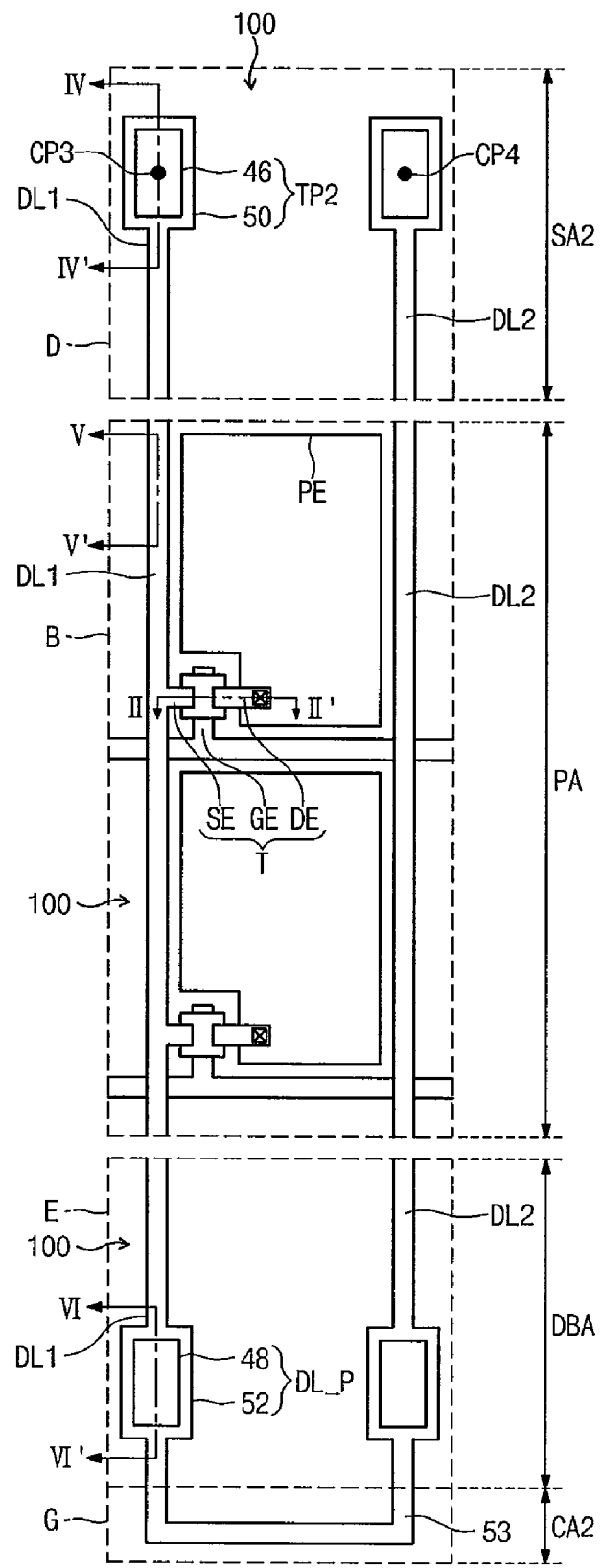
Figure 11B:
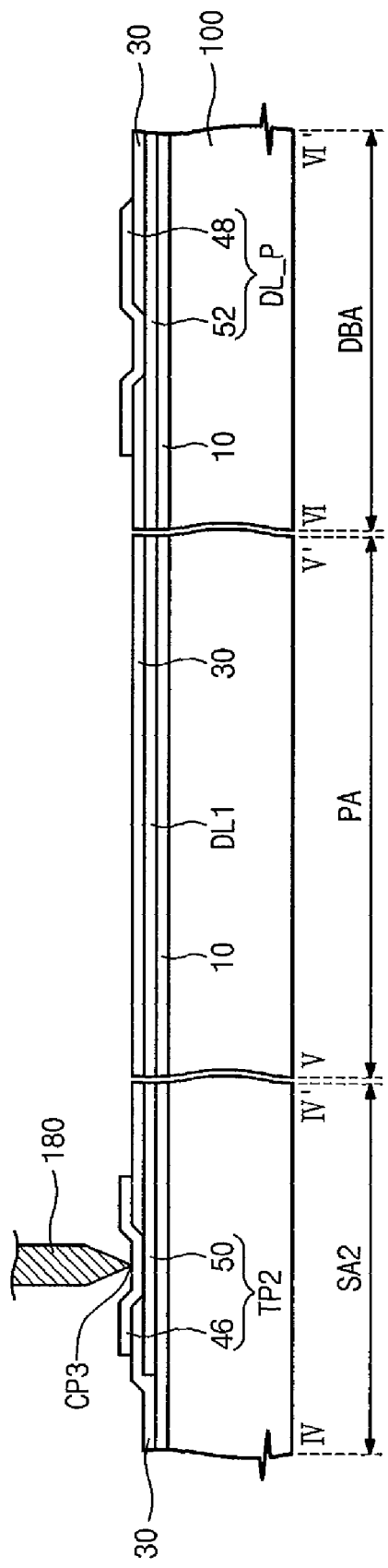

FIG. 11A is a plan view illustrating a forming method of the pixel electrode on the array substrate, and FIG. 11B is a cross-sectional view taken along lines IV-IV', V-V', and VI-VI' of FIG. 11A.

Referring to FIGS. 11A and 11B, the fifth contact portion 46 and the sixth contact portion 48 are formed on the array substrate 100.

More particularly, the fifth contact portion 46 is formed on the first data line end portion 50 in the second peripheral area SA2 and electrically connected to the first data line end portion 50. The sixth contact portion 48 is formed on the second data line end portion 52 in the data bonding area DBA and electrically connected to the second data line end portion 52.

Referring again to FIG. 9A, the fifth contact portion 46 and the sixth contact portion 48 are formed through the same process as the second contact portion 40, the fourth contact portion 43, and the pixel electrode PE. That is, plan views in FIG. 9A and FIG. 11A are taken from different portions of the liquid crystal display, but the forming process for the second contact portion 40, the fourth contact portion 43, and the pixel electrode PE in FIG. 9A and the forming process for the fifth and sixth contact portions 46 and 48 in FIG. 11A are the same process.

After the fifth contact portion 46 and the sixth contact portion 48 are formed on the array substrate 100, a function test of the first data line DL1 and the second data line DL2 is performed by an electrical signal input to the third contact point CP3 through the third test pin 180 and output from the fourth contact point CP4 through a fourth test pin (not shown). The function test is performed to check whether the first data line DL1 and the second data line DL2 are broken and/or to check whether the first data line DL1 and the second data line DL2 are shorted to each other.

In the present exemplary embodiment, in order to test the first data line DL1 and the second data line DL2 that are electrically connected to each other through the preliminary data line 53, the electrical signal input to the third contact point CP3 and output from the fourth contact point CP4 is used. However, the function test may be individually performed with respect to each of the first data line DL1 and the second data line DL2. For instance, when the first data line DL1 is formed, a data line test part (not shown) may be further formed between the pixel area PA and the data bonding area DBA. Then, the first data line DL1 may be tested by using the first data line end portion 50 and the data line test part. The data line test part may be extended from the first data line DL1, and the data line test part may have a width that is wider than the first data line DL1 and a same structure as that of the second test pad TP2.

According to the above, in the array substrate on which a plurality of thin layers is formed, the gate line and the data line may be tested before or after each layer is formed to check their function.

Although exemplary embodiments of the present invention have been described, it is understood that the present invention should not be limited to these exemplary embodiments but that various changes and modifications can be made by one of ordinary skill in the art within the spirit and scope of the present invention as hereinafter claimed.

What is claimed is:

1. A method of manufacturing a display apparatus, comprising:
   preparing a first substrate on which a pixel area, a first pad area, and a second pad area are defined;
   forming a gate line on the first substrate;
   forming a first insulating layer pattern on the gate line;
   forming a data line on the first substrate;
   forming a first contact portion that is arranged above the gate line and electrically connected to the gate line in a first peripheral area spaced apart from the first pad area to form a first test pad;
   testing the gate line using the first contact portion as a terminal;
   forming a second contact portion arranged above the first contact portion and electrically connected to the first contact portion and the gate line;
   forming a second insulating layer pattern on the data line;
   forming a pixel electrode in the pixel area;
   testing the gate line using the second contact portion as a terminal; and
   combining a second substrate on which a common electrode is formed with the first substrate.

2. The method of claim 1, wherein the first contact portion is formed by a same process as the data line and comprises a same material as the data line, and the second contact portion is formed by a same process as the pixel electrode and comprises a same material as the pixel electrode.

3. The method of claim 1, further comprising forming a gate pad in the first pad area, and
   wherein the gate pad is formed by:
   forming a third contact portion arranged above the gate line in the first pad area and electrically connected to the gate line, the third contact portion being formed by a same process as the data line and comprising a same material as the data line; and
   forming a fourth contact portion arranged above the third contact portion and electrically connected to the third contact portion and the gate line, the fourth contact portion being formed by a same process as the pixel electrode and comprising a same material as the pixel electrode.

4. The method of claim 1, further comprising:
   forming a fifth contact portion arranged above the data line in a second peripheral area that is spaced apart from the second pad area, the fifth contact portion being electrically connected to the data line to form a second test pad, and
   wherein the fifth contact portion is formed through a same process as the pixel electrode and comprises a same material as the pixel electrode.

5. The method of claim 4, further comprising testing the data line using the fifth contact portion as a terminal after the pixel electrode and the fifth contact portion are formed.

6. The method of claim 1, further comprising forming a data pad in the second pad area,
   wherein forming the data pad comprises forming a sixth contact portion above the data line in the second pad area, the sixth contact portion being electrically connected to the data line, and the sixth contact portion being formed through a same process as the pixel electrode and comprising a same material as the pixel electrode.

7. The method of claim 1, wherein the first substrate comprises a plastic material.

8. A method of manufacturing a display apparatus, the method comprising the following steps:
   providing a first substrate comprising a pixel area and a peripheral area;
   forming a first conductive layer on the first substrate and patterning the first conductive layer to define gate lines extending in a first direction across the pixel area, each gate line comprising gate electrodes, a gate line test portion located in the peripheral area at a first side of the pixel area and each gate line comprising a gate line bonding portion located in the peripheral area at a second side of the pixel area, the second side of the pixel area being opposite the first side of the pixel area, and a preliminary gate line connected to at least two gate line bonding portions to electrically connect with at least two gate lines;
   forming a first insulating layer on the first conductive layer, and patterning the first insulating layer to provide via holes exposing the gate line test portions;
   forming semiconductor regions on the first insulating layer above the gate electrodes;
   forming a second conductive layer on the first insulating layer and patterning the second conductive layer to define data lines extending in a second direction across the pixel area, the second direction being substantially perpendicular to the first direction, each data line comprising a data line test portion located in the peripheral region at a third side of the pixel area and a data line bonding portion located in the peripheral area at a fourth side of the pixel area, the third side of the pixel area being opposite the fourth side of the pixel area, and a preliminary data line connected to at least two data line bonding portions and thus electrically connected to at least two data lines;
   forming a second insulating layer on the second conductive layer and patterning the second insulating layer to provide thru-holes above the gate line test portions and above the data line test portions;
   forming a pixel layer on the second insulating layer and patterning the pixel layer to provide pixel electrodes;
   applying, after one or more of the steps recited above, a test voltage between first and second gate lines via first and second gate line test line portions; and
   removing the preliminary gate line and the preliminary data line.

9. The manufacturing method of claim 8 further comprising:
   applying a test voltage between first and second data lines via first and second data line test portions after one or more of the steps of patterning the second conductive layer, patterning the second insulating layer and patterning the pixel layer.

* * * * *